(12) United States Patent
Lienau

(10) Patent No.: US 7,796,420 B2
(45) Date of Patent: Sep. 14, 2010

(54) COIL SENSOR MEMORY DEVICE AND METHOD

(76) Inventor: Richard Lienau, HC 74 Box 19Z, Pecos, NM (US) 87552

( * ) Notice: Subject to any disclaimer, the term of this patent is extended or adjusted under 35 U.S.C. 154(b) by 399 days.

(21) Appl. No.: 11/936,637

(22) Filed: Nov. 7, 2007

(65) Prior Publication Data

US 2008/0106932 A1 May 8, 2008

Related U.S. Application Data

(60) Provisional application No. 60/864,638, filed on Nov. 7, 2006.

(51) Int. Cl.
*G11C 11/00* (2006.01)
(52) U.S. Cl. .................... 365/158; 365/171; 365/173
(58) Field of Classification Search ............. 365/158, 365/171, 173
See application file for complete search history.

(56) References Cited

U.S. PATENT DOCUMENTS

| | | | |
|---|---|---|---|
| 5,295,097 A | 3/1994 | Lienau | |
| 5,989,406 A * | 11/1999 | Beetz et al. | 205/118 |
| 6,122,818 A * | 9/2000 | Lee | 29/603.12 |
| 6,140,139 A | 10/2000 | Lienau et al. | |
| 6,229,729 B1 | 5/2001 | Lienau | |
| 6,288,929 B1 | 9/2001 | Lienau | |
| 6,317,354 B1 | 11/2001 | Lienau | |
| 6,330,183 B1 | 12/2001 | Lienau | |
| 6,341,080 B1 | 1/2002 | Lienau et al. | |
| 6,388,918 B1 * | 5/2002 | McDowell et al. | 365/171 |
| 6,545,908 B1 | 4/2003 | Lienau | |
| 6,711,069 B2 | 3/2004 | Lienau | |
| 6,864,711 B2 | 3/2005 | Lienau | |
| 6,873,546 B2 | 3/2005 | Lienau | |
| 7,023,727 B2 | 4/2006 | Lienau et al. | |
| 7,123,050 B2 | 10/2006 | Lienau | |

* cited by examiner

*Primary Examiner*—Son Dinh
(74) *Attorney, Agent, or Firm*—Advantia Law Group; Michael W. Starkweather

(57) ABSTRACT

A non-volatile random access memory device. The non-volatile random access memory device may include a magnetic bit, a write/sense, and a read pulse module. The read pulse module may be configured to send a read pulse signal to the magnetic bit. In addition, a write module may be in communication with the write/sense coil and may be configured to thereby change the magnetic bit between a first magnetic polarity state and a second magnetic polarity state. A read module may be in communication with the write/sense coil and may be configured to detect a first characteristic of the write/sense coil when a read pulse signal is delivered to the magnetic bit in the first magnetic polarity state and to detect a second characteristic of the write/sense coil when a read pulse signal is delivered to the magnetic bit in the second magnetic polarity state.

23 Claims, 10 Drawing Sheets

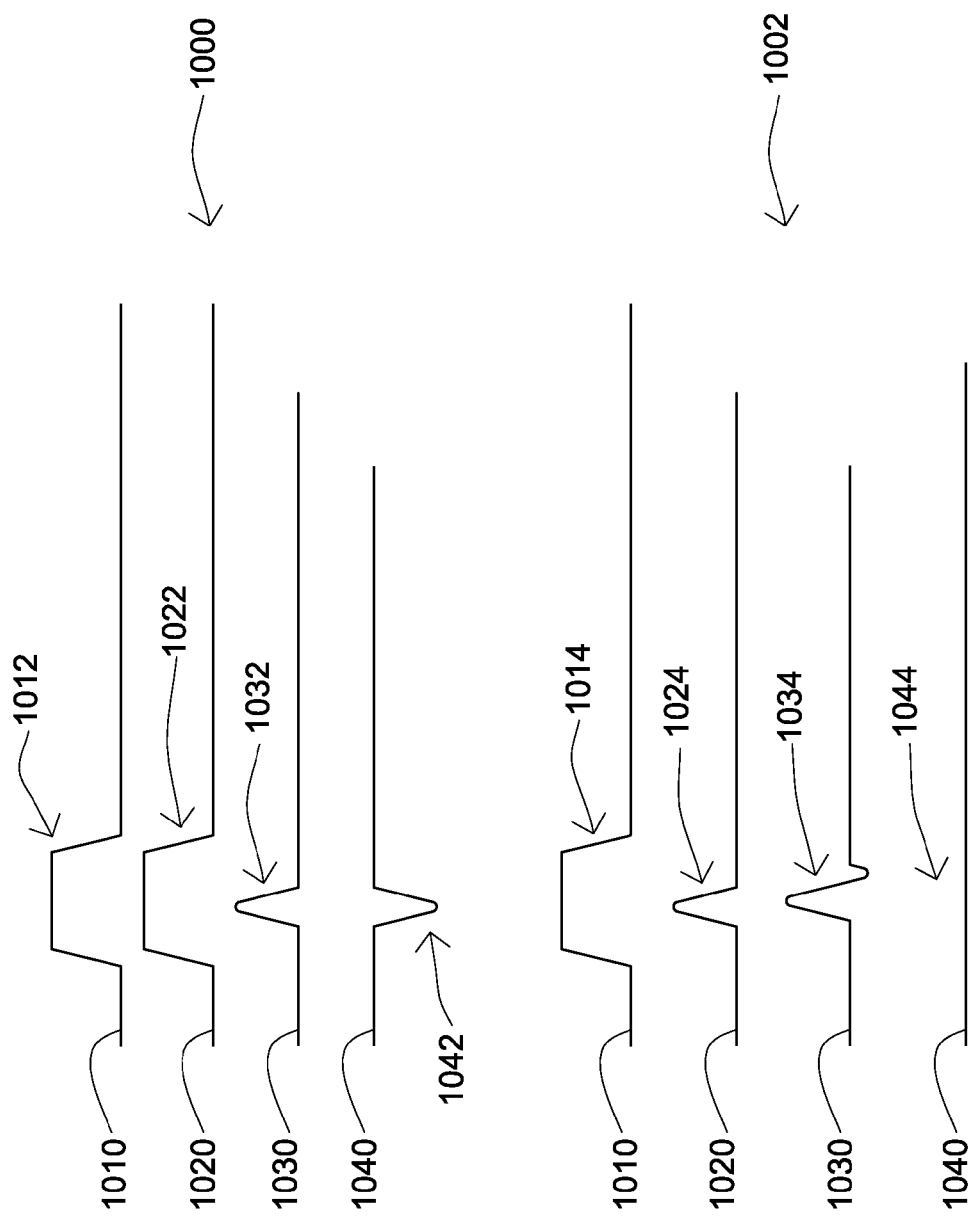

COIL SENSOR MEMORY DEVICE AND METHOD

CROSS-REFERENCE TO RELATED APPLICATIONS

This invention claims priority, under 35 U.S.C. §120, to the U.S. Provisional Patent Application No. 60/864,638 to Richard Lienau filed on 7 Nov. 2006 which is incorporated by reference herein.

BACKGROUND OF THE INVENTION

1. Field of the Invention

The present invention relates to memory devices and methods, specifically to magnetic non-volatile memory devices and methods.

2. Description of the Related Art

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. The constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a non-volatile memory device that does not need to be refreshed and is inexpensive and quick to make. Additionally, in a ferromagnetic memory array, it has generally been necessary to provide a wholly separate circuit to detect the polarity, and thus the binary value, of the remnant magnetic field of a ferromagnetic digital memory cell. For example, many current ferromagnetic memories use such techniques as "giant magneto resistance" and the Hall effect to sense the magnetic polarity of memory bits. These require circuitry in addition to that used for state change, and in some cases many extra steps to fabricate. The requirement of a separate sensing circuit adds considerably to the time and expense of fabrication. This additional circuitry also limits the density of the memory cells in an array, and effects the time required to read, or sense the magnetic polarity, or value.

In the digital memory arena, especially random access memory, fast, dense non-volatility is an advantage. Accordingly, it is desirable to have a non-volatile memory array wherein the remnant magnetic field is sensed with the same circuitry used to write, or effect the state change of, a ferromagnetic bit in such a memory cell.

Some improvements have been made in the field. Examples of references related to the present invention are described below, and the supported teachings of each reference are incorporated by reference herein:

U.S. Pat. No. 7,123,050 to Lienau and entitled Programmable array logic circuit employing non-volatile ferromagnetic memory cells describes a programmable array logic circuit whose temporary memory circuitry employs single bit non-volatile ferromagnetic memory cells. The ferromagnetic memory cells or bits store data even when there is no power provided to the circuitry, thus saving power during operation of the programmable logic circuitry, and ensuring that there is no loss of the data should there be a temporary power shut down. Additionally, the ferromagnetic cells provide for indefinite number of switching actions on the data without degradation to the capacity to store data therein. There is described an integrated circuit, comprising a programmable logic circuit array having product lines and input lines therein, and a storage register circuit. The storage register circuit has a ferromagnetic bit and sensor coupled to store a remnant control signal and an output transistor, coupled to be responsive to the remnant control signal on its gate, and coupled between an input and product line. Additionally, the integrated circuit may further include a logical AND array and a logical OR array.

U.S. Pat. No. 7,023,727 to Lienau and entitled Non-volatile ferromagnetic memory having sensor circuitry shared with its state change circuitry describes a ferromagnetic memory cell is disclosed having a base, oriented in a horizontal plane, a bit, made of a ferromagnetic material, and a sense/write line, positioned proximate the bit sufficient to detect the directed polarity of the bit when a first current is applied thereto, and to direct the polarity of the bit when a second larger current is applied thereto in a given direction. The bit has a height that is oriented perpendicular to the horizontal plane of the base, and a polarity that can be directed along the height.

U.S. Pat. No. 6,873,546 to Lienau and entitled Method and apparatus for reading data from a ferromagnetic memory cell describes a ferromagnetic memory cell is disclosed. The cell includes a bit, made of a ferromagnetic material, having a remnant polarity. The cell also includes a read drive line coupled to a first portion of the bit, to feed a current into the bit. A sense conductor is coupled to a second portion of the bit, to receive the current from the bit. The current conducted through the bit is responsive to the polarity of the bit. A method is also disclosed for determining the magnetic polarity of a ferromagnetic bit. In this method, a bit is provided that is made of ferromagnetic material and has a remnant polarity. An input current is fed into the bit through a read drive line coupled to a first portion of the bit. An output current is received from the bit through a sense conductor coupled to a second portion of the bit. The current conducted through the bit is responsive to the polarity of the bit. A variance between the input current and output current is then sensed, from which the magnetic polarity of the bit is determined.

U.S. Pat. No. 6,864,711 to Lienau and entitled Programmable array logic circuit whose product and input line junctions employ single bit non-volatile ferromagnetic cells describes a programmable array logic circuit whose temporary memory circuitry employs single bit non-volatile ferromagnetic memory cells. There is described an integrated circuit, comprising a programmable logic circuit array having product lines and input lines therein, and a storage register circuit. The storage register circuit has a ferromagnetic bit and sensor coupled to store a remnant control signal and an output transistor, coupled to be responsive to the remnant control signal on its gate, and coupled between an input and product line. Additionally, the integrated circuit may further include a logical AND array and a logical OR array.

U.S. Pat. No. 6,711,069 to Lienau and entitled Register having a ferromagnetic memory cells describes a register. There is described use of a non->volatile ferromagnetic memory cell to store binary data in a register or flip-flop circuit. There is described a latching circuit, comprising an input line entering the latching circuit for receiving a signal, an output line, electrically coupled to the input line, for outputting the signal, and a ferromagnetic bit and sensor coupled between the input line and the output line, to store a form of the signal in the ferromagnetic bit even when power has been suspended to the latching circuit.

U.S. Pat. No. 6,545,908 to Lienau and entitled Dual conductor inductive sensor for a non-volatile random access ferromagnetic memory describes a nonvolatile ferromagnetic RAM device which is capable of reading the data stored in each magnet quickly and efficiently utilizing a minimal number of components. Specifically there is a nonvolatile ferromagnetic RAM which is capable of reading the data stored in each magnetic bit. The ferromagnetic memory cell, comprising of a base that is oriented in a horizontal plane. There is also a bit, made of a ferromagnetic material, having: a height that is oriented perpendicular to the horizontal plane of the base, and a polarity that can be directed along the height. Additionally, there is a sense line, positioned proximate the bit sufficient to detect the directed polarity of the bit; and a write line, positioned proximate the bit sufficient to direct the polarity of the bit. Additionally, there is a detector, coupled to the sense line; and a sample drive line, positioned proximate the bit to transmit an electric pulse that will increase the directed polarity of the bit sufficient to induce a wave into the sense line that can be detected by the detector.

U.S. Pat. No. 6,341,080 to Lienau and entitled Hall effect ferromagnetic random access memory device and its method of manufacture describes a Hall effect ferromagnetic non-volatile random access memory cell comprising a Hall effect sensor adjacent to a ferromagnetic bit which is surrounded by a drive coil. The coil is electrically connected to a drive circuit, and when provided with an appropriate current creates a residual magnetic field in the ferromagnetic bit, the polarity of which determines the memory status of the cell. The Hall effect sensor is electrically connected via four conductors to a voltage source, ground, and two read sense comparator lines for comparing the voltage output to determine the memory status of the cell. The read and write circuits are arranged in a matrix of bit columns and byte rows. A method for manufacturing said Hall effect ferromagnetic non-volatile random access memory cell.

U.S. Pat. No. 6,330,183 to Lienau and entitled Dual conductor inductive sensor for a non-volatile random access ferromagnetic memory describes a nonvolatile ferromagnetic RAM device which is capable of reading the data stored in each magnet quickly and efficiently utilizing a minimal number of components. Specifically there is a nonvolatile ferromagnetic RAM which is capable of reading the data stored in each magnetic bit. The ferromagnetic memory cell, comprising of a base that is oriented in a horizontal plane. There is also a bit, made of a ferromagnetic material, having: a height that is oriented perpendicular to the horizontal plane of the base, and a polarity that can be directed along the height. Additionally, there is a sense line, positioned proximate the bit sufficient to detect the directed polarity of the bit; and a write line, positioned proximate the bit sufficient to direct the polarity of the bit. Additionally, there is a detector, coupled to the sense line; and a sample drive line, positioned proximate the bit to transmit an electric pulse that will increase the directed polarity of the bit sufficient to induce a wave into the sense line that can be detected by the detector.

U.S. Pat. No. 6,317,354 to Lienau and entitled Non-volatile random access ferromagnetic memory with single collector sensor describes a non-volatile RAM device is disclosed which utilizes a plurality of ferromagnetic bits each surrounded by a coil of a write line for directing the remnant polarity thereof is disclosed. The direction of magnetic remnance in each bit is dictated by the direction of a current induced into write line. Further, a magneto sensor comprising a magneto resistor coupled to a collector is placed approximate each bit. The magneto resistor is coupled to a control circuit for receiving current. The current passing across magneto resistor is biased in a direction either right or left of the original current flow direction. The collector is coupled to a sense line, which in turn, is coupled to an amplifier. When current flow is biased in the direction of the collector, the serial resistance of the magneto resistor will be decreased, and the sense line will receive a high amount of current. However, when current flow is biased in the direction away from the collector, then the serial resistance of the magneto resistor will be effectively increased, and the sense line will receive a small amount of current. The presence and amount of current in the sense line is amplified and detected by the amplifier.

U.S. Pat. No. 6,288,929 to Lienau and entitled Magneto resistor sensor with differential collectors for a non-volatile random access ferromagnetic memory describes a non-volatile RAM device which utilizes a plurality of ferromagnetic bits each surrounded by a coil of a write line for directing the remnant polarity thereof is disclosed. The direction of magnetic remnance in each bit is dictated by the direction of a current induced into write line. Further, a magneto sensor comprising a magneto resistor coupled to a pair of collectors is placed approximate each bit. The magneto resistor is coupled to a control circuit for receiving current. The current passing across magneto resistor is biased in a direction either right or left of the original current flow direction. The collectors are coupled to a pair of sense lines, which are in turn, coupled to a voltage differential amplifier. The collector in the direction of biased current flow, will receive a greater number of electrons than the other collector, and therefore have a greater negative charge. This voltage differential is conducted through the sense lines to the voltage differential amplifier, where it is amplified and detected.

U.S. Pat. No. 6,266,267 to Lienau and entitled Single conductor inductive sensor for a non-volatile random access ferromagnetic memory describes a nonvolatile ferromagnetic RAM device and method that is capable of reading the data stored in each magnet quickly and efficiently utilizing a minimal number of components. Specifically, there is a nonvolatile ferromagnetic RAM which is capable of reading the data stored in each magnetic bit. There is a ferromagnetic memory cell, comprising a bit, made of a ferromagnetic material, having a remnant polarity. A write line, located proximate the bit, is coupled to receive: 1) a first current sufficient to create the remnant polarity, and 2) a pulsed second current, insufficient to create any remnant polarity, but sufficient to potentially fluctuate the remnant polarity during the second current pulse. A sense line, positioned proximate the bit, has the purpose of detecting any potentially created remnant polarity fluctuation.

U.S. Pat. No. 6,229,729 to Lienau and entitled Magneto resistor sensor with diode short for a non-volatile random access ferromagnetic memory describes a non-volatile RAM device is disclosed which utilizes a plurality of ferromagnetic bits each surrounded by a write coil for directing the remnant polarity thereof is disclosed. The direction of magnetic remnance in each bit is dictated by the direction of a current induced into write coil. Further, a magneto sensor comprising a magneto resistor coupled to a diode is placed approximate each bit. The magneto resistor is coupled to a sense line, and receives current at a first point of attachment, and returns current at a second point of attachment. The current passing across magneto resistor is biased in a direction either right or left of the original current flow direction. If current is biased toward the anode end of diode then it is complimentary to the preferred flow direction of diode, and flows easily there across. The ultimate effect is that the serial resistance of magneto resistor is reduced, allowing a greater amount of current to pass into the sense line. When current is biased toward the cathode end of diode, then it is contrary to the preferred flow direction of the diode, and does not flow easily there across. The ultimate effect is that the serial resistance of magneto resistor is increased, allowing a smaller amount of current to pass into sense line. The presence and amount of current found in the sense line between the bit and the detector determines whether a digital value of "1" or "0" is stored in the magnetic bit. A method for storing binary data is also disclosed.

U.S. Pat. No. 6,140,139 to Lienau and entitled Hall effect ferromagnetic random access memory device and its method of manufacture describes a Hall effect ferromagnetic nonvolatile random access memory cell comprising a Hall effect sensor adjacent to a ferromagnetic bit which is surrounded by a drive coil. The coil is electrically connected to a drive circuit, and when provided with an appropriate current creates a residual magnetic field in the ferromagnetic bit, the polarity of which determines the memory status of the cell. The Hall effect sensor is electrically connected via four conductors to a voltage source, ground, and two read sense comparator lines for comparing the voltage output to determine the memory status of the cell. The read and write circuits are arranged in a matrix of bit columns and byte rows.

U.S. Pat. No. 5,295,097 to Lienau and entitled Nonvolatile random access memory describes a nonvolatile random access memory is disclosed having a substrate carrying separate magnetically polarizable domains each surrounded by a full write loop member and arranged to penetrate the Hall channel of a dual drain FET with its residual magnetic field. The domains are organized in word rows and bit columns, are each written to by a single full write current through the surrounding loop member and each read by a comparator connected to the FET drains.

One or more of the inventions heretofore known suffer from a number of disadvantages which include requiring the inclusion of many components; requiring the inclusion of many manufacturing steps; requiring many masks to produce; consuming a great amount of power per bit; requiring exotic chemical processing; and being otherwise expensive and/or difficult to manufacture.

What is needed is a memory device and/or method that solves one or more of the problems described herein and/or one or more problems that may come to the attention of one skilled in the art upon becoming familiar with this specification.

SUMMARY OF THE INVENTION

The present invention has been developed in response to the present state of the art, and in particular, in response to the problems and needs in the art that have not yet been fully solved by currently available memory devices. Accordingly, the present invention has been developed to provide a non-volatile memory device and/or method.

There may be a non-volatile memory device that may include a magnetic bit electrically coupled to a read module and proximate a write/sense coil. The write/sense coil may consists of or consist essentially of a single loop disposed about the magnetic bit. The read module may consists of or consist essentially of a read select line and/or a ground that may each be coupled near opposite ends of the magnetic bit. The magnetic bit may include a high aspect-ratio, ferromagnetic material.

There may be a non-volatile random access memory device that may include one or more of the following: a magnetic bit having a first end and a second end; a write/sense coil that may be proximate the magnetic bit and not in electrical communication with the magnetic bit; a read pulse module that may be in electrical communication with the magnetic bit at the first end and at the second end and configured to send a read pulse signal to the magnetic bit; a write module that may be in electrical communication with the write/sense coil and/or configured to change the magnetic bit between a first magnetic polarity state and a second magnetic polarity state; a read module that may be in sensory communication with the write/sense coil and/or configured to detect a first electrical characteristic of the write/sense coil when a read pulse signal is delivered to the magnetic bit in the first magnetic polarity state and/or to detect a second electrical characteristic of the write/sense coil when a read pulse signal is delivered to the magnetic bit in the second magnetic polarity state; a cell select module that may be in electrical communication with the write/sense coil and/or configured to selectably electrically isolate the write sense coil; and a byte select gate that may be in communication with the cell select module and/or configured to toggle function of the cell select module.

The write/sense coil may loop about the magnetic bit and may do so only a single time. The write/sense coil may be disposed near one of the first and the second ends of the magnetic bit. The write/sense coil may include a single loop and/or a pair of arms extending from the loop.

The read pulse module may include a read select line and/or a read return line, wherein the read return line may include a ground plane layer that may be disposed over a substrate. The read pulse module may include a current limiting resistor. The read pulse module may effectively include only a single current limiting resistor and may serve a plurality of memory devices.

The read module may include a comparator.

The cell select module may selectably electrically isolate the write/sense coil from the write module. The cell select module may selectably electrically isolate the write/sense coil from the read module. The cell select module may include a field effect transistor. The cell select module may consist of or consist essentially of a single field effect transistor.

The byte select gate may be in electrical communication with a gate of a field effect transistor.

There is also a method of storing and reading data, including one or more of the steps of: toggling a magnetic characteristic of a magnetic bit by applying a current through a coil intimate to the magnetic bit; applying a current through the magnetic bit while observing electrical properties of the coil; providing a coil looped about the magnetic bit; and controlling the application of current through the coil with a field effect transistor. The step of toggling may further include altering the magnetic polarity of the magnetic bit between a first polarity state and a second polarity state.

There is also described a method of storing and reading data, including one or more of the steps of: providing a magnetic bit; providing a coil disposed about the magnetic bit but conductively isolated therefrom; toggling the magnetic bit between first and second polarity states by applying a current through the coil; applying a read signal through the magnetic bit; and observing the coil for a induced signal while applying the read signal.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order for the advantages of the invention to be readily understood, a more particular description of the invention briefly described above will be rendered by reference to specific embodiments that are illustrated in the appended drawing(s). It is noted that the drawings of the invention are not to scale. The drawings are mere schematics representations, not intended to portray specific parameters of the invention. Understanding that these drawing(s) depict only typical embodiments of the invention and are not therefore to be considered to be limiting of its scope, the invention will be described and explained with additional specificity and detail through the use of the accompanying drawing(s), in which:

FIG. 5 is a chart showing appropriate combination of FIGS. 6-9.

FIG. 10 is a pair of signal timing diagrams according to one embodiment of the invention.

DETAILED DESCRIPTION OF THE INVENTION

Figure 1:
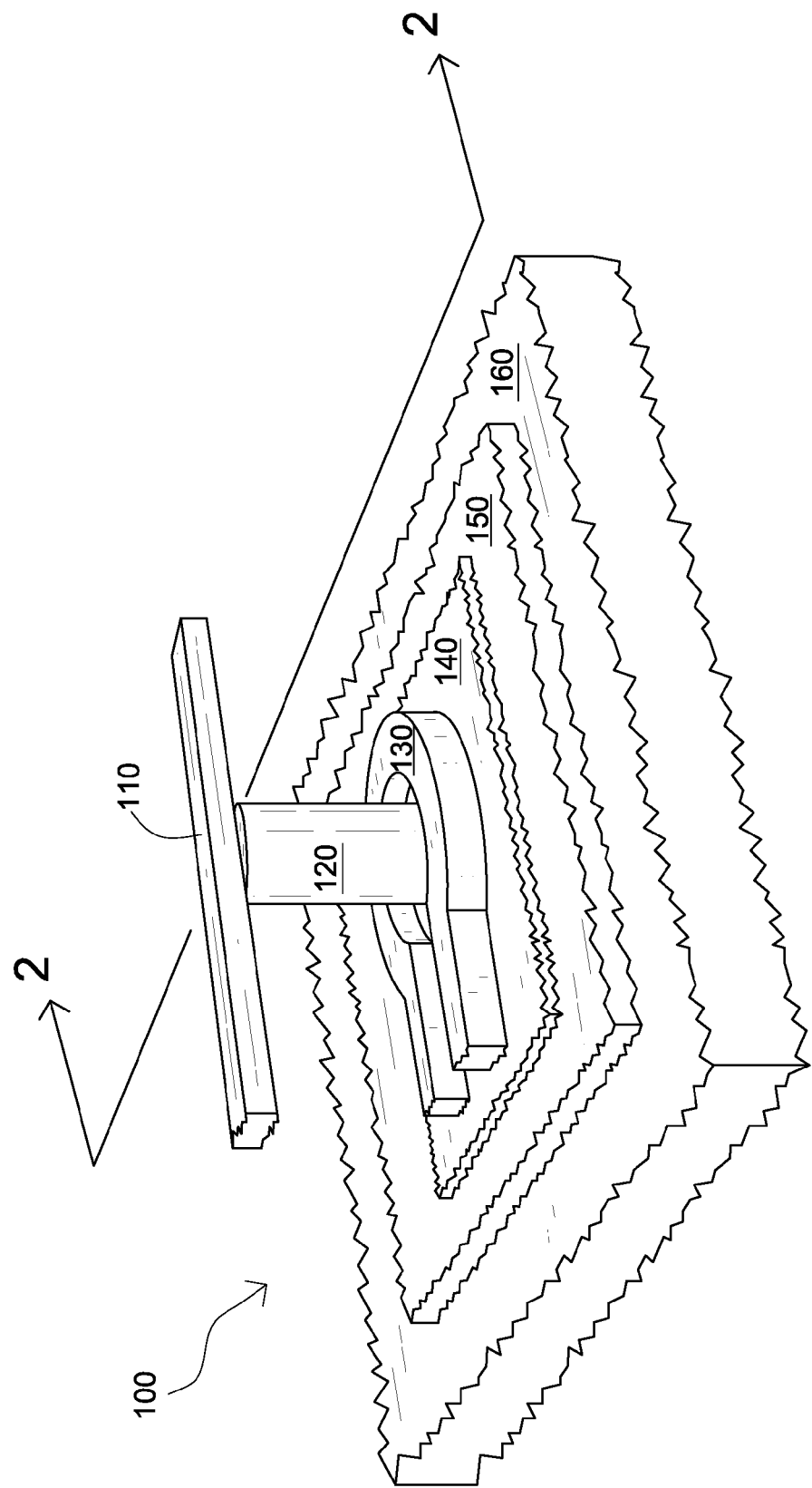
FIG. 1 illustrates a perspective view of a coil sensor memory device according to one embodiment of the invention.

For the purposes of promoting an understanding of the principles of the invention, reference will now be made to the exemplary embodiments illustrated in the drawing(s), and specific language will be used to describe the same. It will nevertheless be understood that no limitation of the scope of the invention is thereby intended. Any alterations and further modifications of the inventive features illustrated herein, and any additional applications of the principles of the invention as illustrated herein, which would occur to one skilled in the relevant art and having possession of this disclosure, are to be considered within the scope of the invention.

Reference throughout this specification to an "embodiment," an "example" or similar language means that a particular feature, structure, characteristic, or combinations thereof described in connection with the embodiment is included in at least one embodiment of the present invention. Thus, appearances of the phrases an "embodiment," an "example," and similar language throughout this specification may, but do not necessarily, all refer to the same embodiment, to different embodiments, or to one or more of the figures. Additionally, reference to the wording "embodiment," "example" or the like, for two or more features, elements, etc. does not mean that the features are necessarily related, dissimilar, the same, etc.

Each statement of an embodiment or example is to be considered independent of any other statement of an embodiment despite any use of similar or identical language characterizing each embodiment. Therefore, where one embodiment is identified as "another embodiment," the identified embodiment is independent of any other embodiments characterized by the language "another embodiment." The features, functions, and the like described herein are considered to be able to be combined in whole or in part one with another as the claims and/or art may direct, either directly or indirectly, implicitly or explicitly.

As used herein, "comprising," "including," "containing," "is," "are," "characterized by," and grammatical equivalents thereof are inclusive or open-ended terms that do not exclude additional unrecited elements or method steps. "Comprising" is to be interpreted as including the more restrictive terms "consisting of" and "consisting essentially of."

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of programmable or executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module and/or a program of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The present invention may be described herein in terms of functional block components, screen shots, user interaction, optional selections, various processing steps, and the like. Each of such described herein may be one or more modules in exemplary embodiments of the invention. It should be appreciated that such functional blocks may be realized by any number of hardware and/or software components configured to perform the specified functions. For example, the present invention may employ or may be employed within various integrated circuit components, e.g., memory elements, processing elements, logic elements, look-up tables, and the like, which may carry out a variety of functions under the control of one or more microprocessors or other control devices. Similarly, the software elements of the present invention may be implemented with any programming or scripting language such as C, C++, Java, COBOL, assembler, PERL, Visual Basic, SQL Stored Procedures, AJAX, extensible markup language (XML), with the various algorithms being implemented with any combination of data structures, objects, processes, routines or other programming elements. Further, it should be noted that the present invention may employ any number of conventional techniques for data transmission, signaling, data processing, network control, and the like. Still further, the invention may detect or prevent security issues with a client-side scripting language, such as JavaScript, VBScript or the like.

Figure 2:
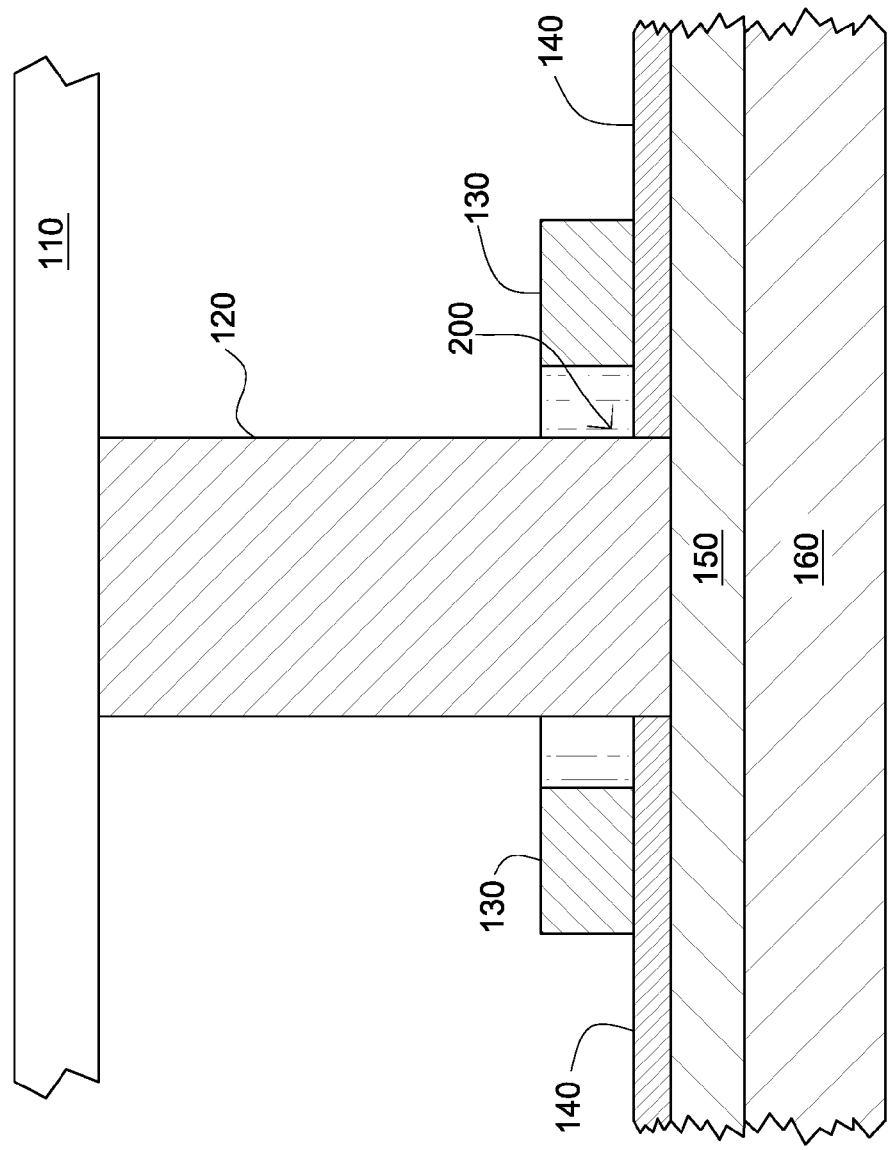
FIG. 2 illustrates a cross-sectional view of the coil sensor memory device of FIG. 1 according to one embodiment of the invention.

FIGS. 1 and 2 illustrate a coil sensor memory device according to one embodiment of the invention. The illustrated coil sensor memory device is a non-volatile memory device capable of storing information and retaining such information even when deprived of power.

There is shown a magnetic bit 120 electrically coupled to a read select line 110 and a ground 150, together forming a read module or read pulse module. The illustrated magnetic bit 120 comprises a material that may change one or more characteristics while exposed to a magnetic or electromagnetic field. As a non-limiting example, a magnetic bit 120 may comprise a high-aspect ratio cylinder of ferromagnetic material disposed on/in a wafer.

The illustrated read select line 110 is ohmically coupled to an end of the magnetic bit and the illustrated ground or ground plane 150 is coupled to an opposite end of the magnetic bit 120. Accordingly, when a voltage is applied across the read module, it is understood that a current flows through the magnetic bit 120 thereby potentially inducing signals in proximate conductors.

Proximate to the magnetic bit is a write/sense coil 130 disposed in a loop about the magnetic bit 120 but not in electrical communication therewith. The write/sense coil 130 is proximate the magnetic bit 120 such that signals through one may induce signals through the other. The illustrated write/sense coil 130 rests on an isolating layer 140 restricting electrical communication between the write/sense coil 130 and ground 150. Accordingly, the illustrated write/sense coil 130 is near but not beyond an end of the magnetic bit 120 as the magnetic bit protrudes through an aperture 200 in the isolating layer. Other isolating layers or similar fill material may be included as one skilled in the art would suggest, but are not shown here for clarity.

In operation, a signal may be delivered through the write/sense coil such that a characteristic of the magnetic bit is altered, such as but not limited to between a pair of magnetic states. In particular in the illustrated example, a write signal through the write/sense coil causes a field external to the write/sense coil and through the magnetic bit. The magnetic bit is thereby driven to a particular magnetic state. Later, a user may deliver a read pulse signal through the magnetic bit by activating the read module. An electrical signal is then also induced in the write/sense coil and characteristics of that induced signal give information about the state of the magnetic bit. Such information may be utilized by one or more devices external to the illustrated coil sensor memory device to store and retrieve information. In one non-limiting example, the write/sense coil may be used to toggle the magnetic bit between a first and a second magnetic polarity state, wherein the first and second magnetic polarity states are substantially different such that the induced signal in the write/sense coil is perceptibly different between the states.

Figure 3:
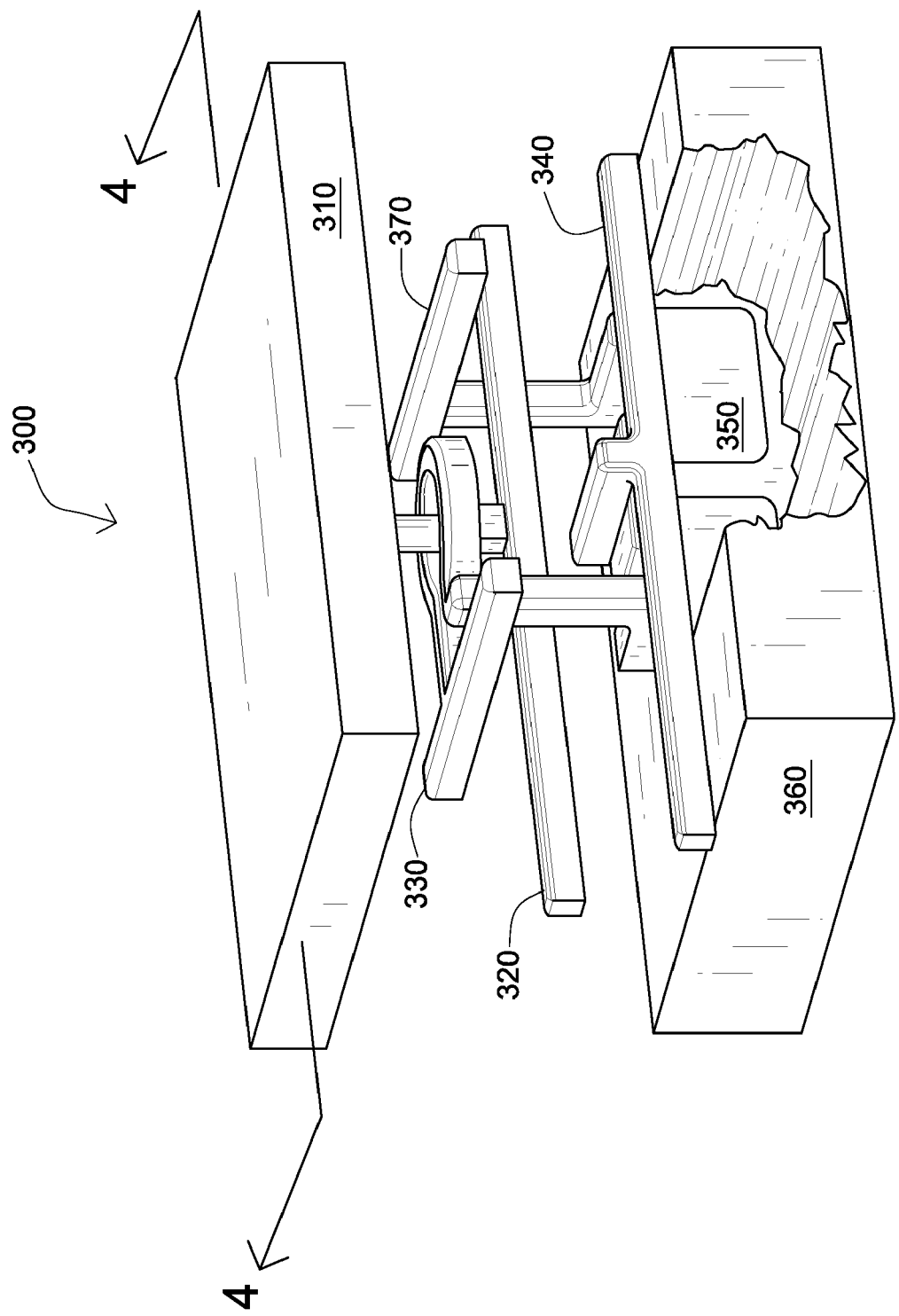
FIG. 3 illustrates a perspective view of a coil sensor memory device according to one embodiment of the invention.
Figure 4:
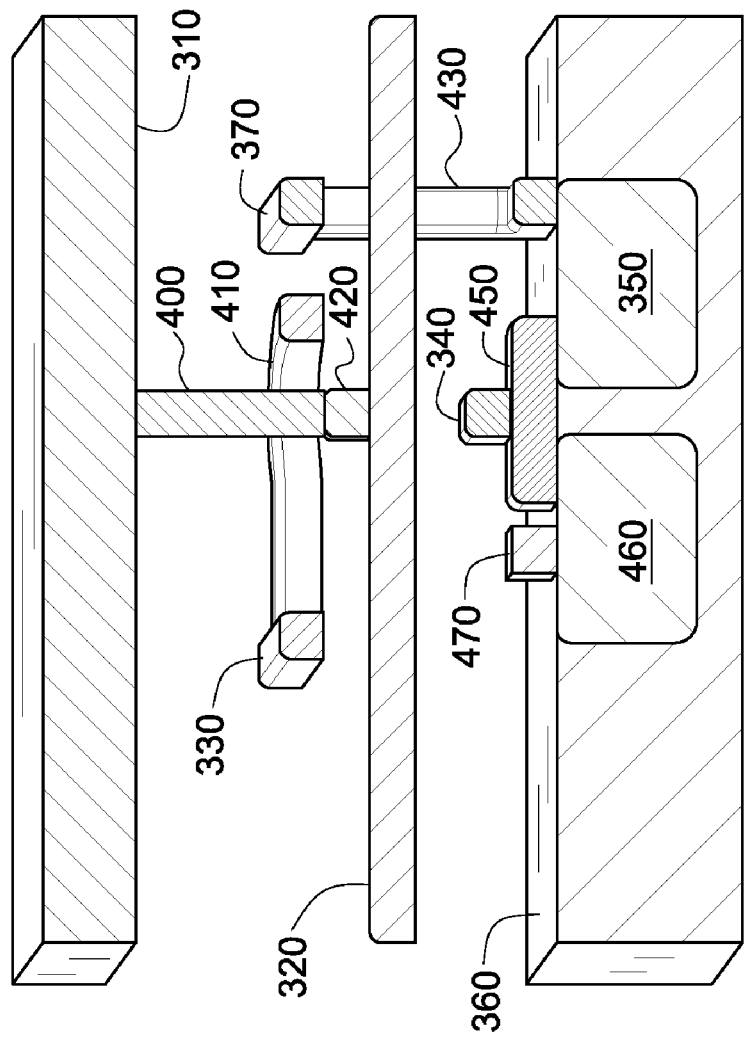
FIG. 4 illustrates a cross-sectional view of the coil sensor memory device of FIG. 3 according to one embodiment of the invention.
Figure 6:
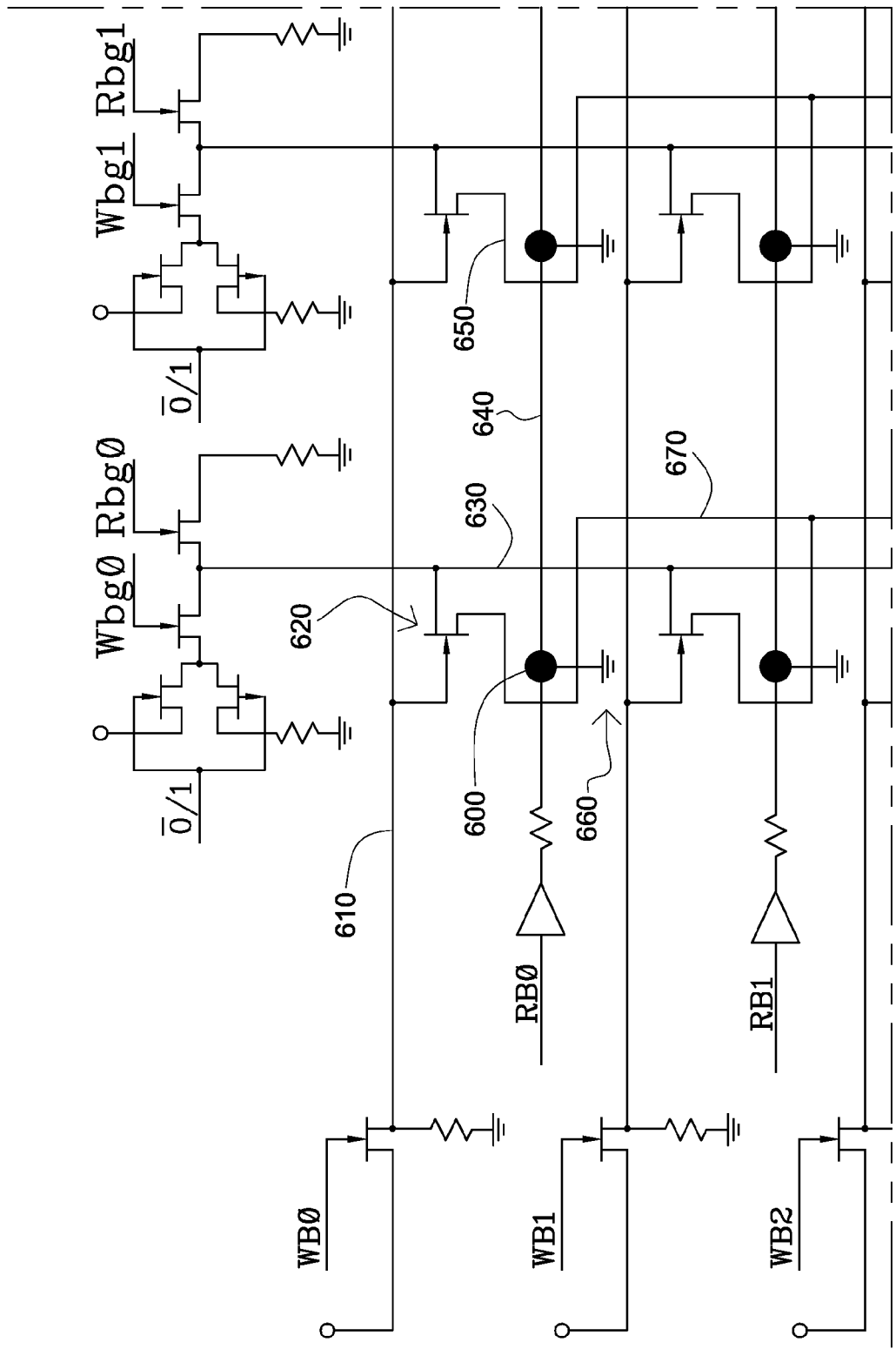
FIGS. 6-9 are together a schematic representation of an array of coil sensor memory devices according to one embodiment of the invention.
Figure 7:
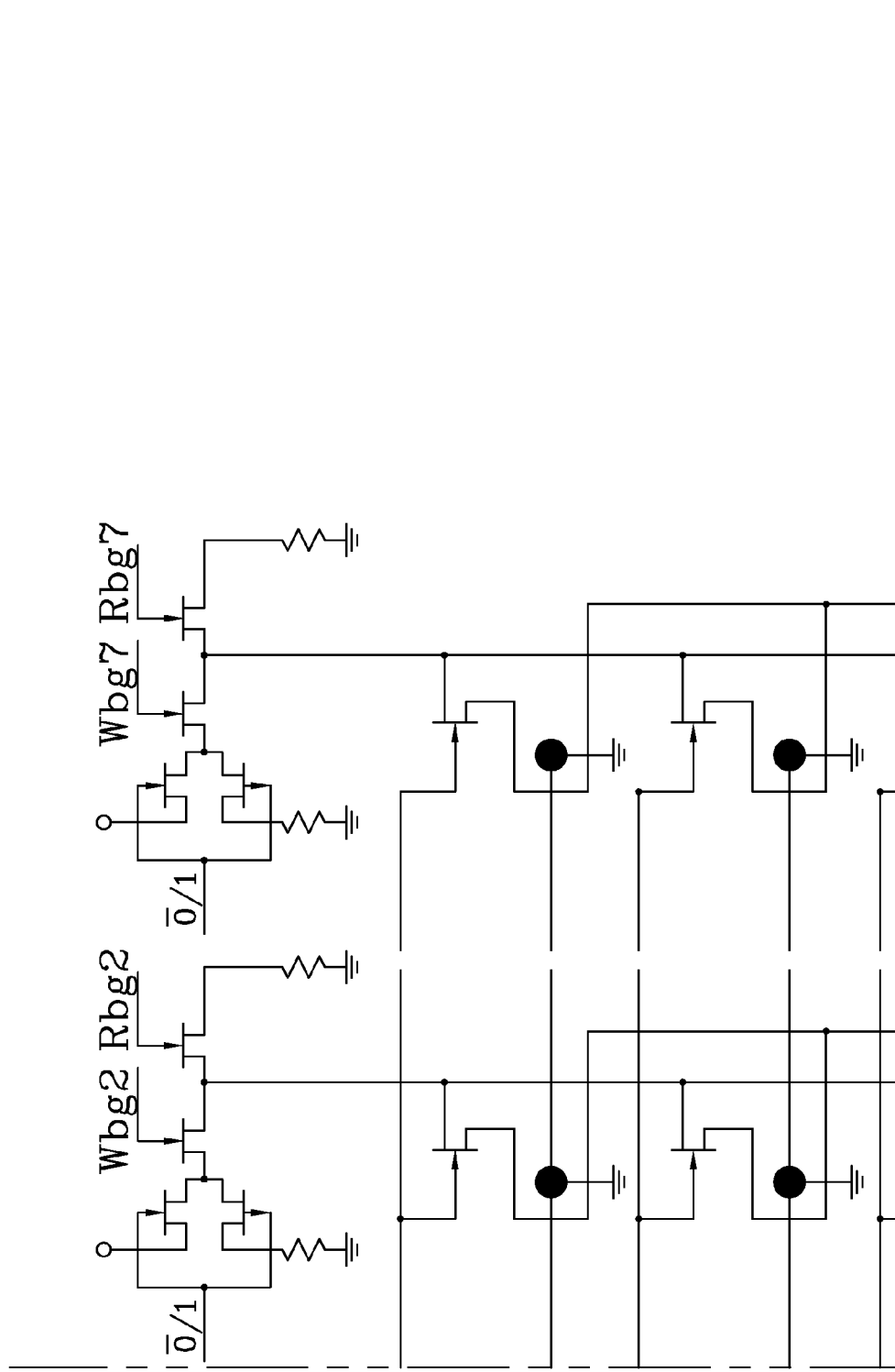
Figure 8:
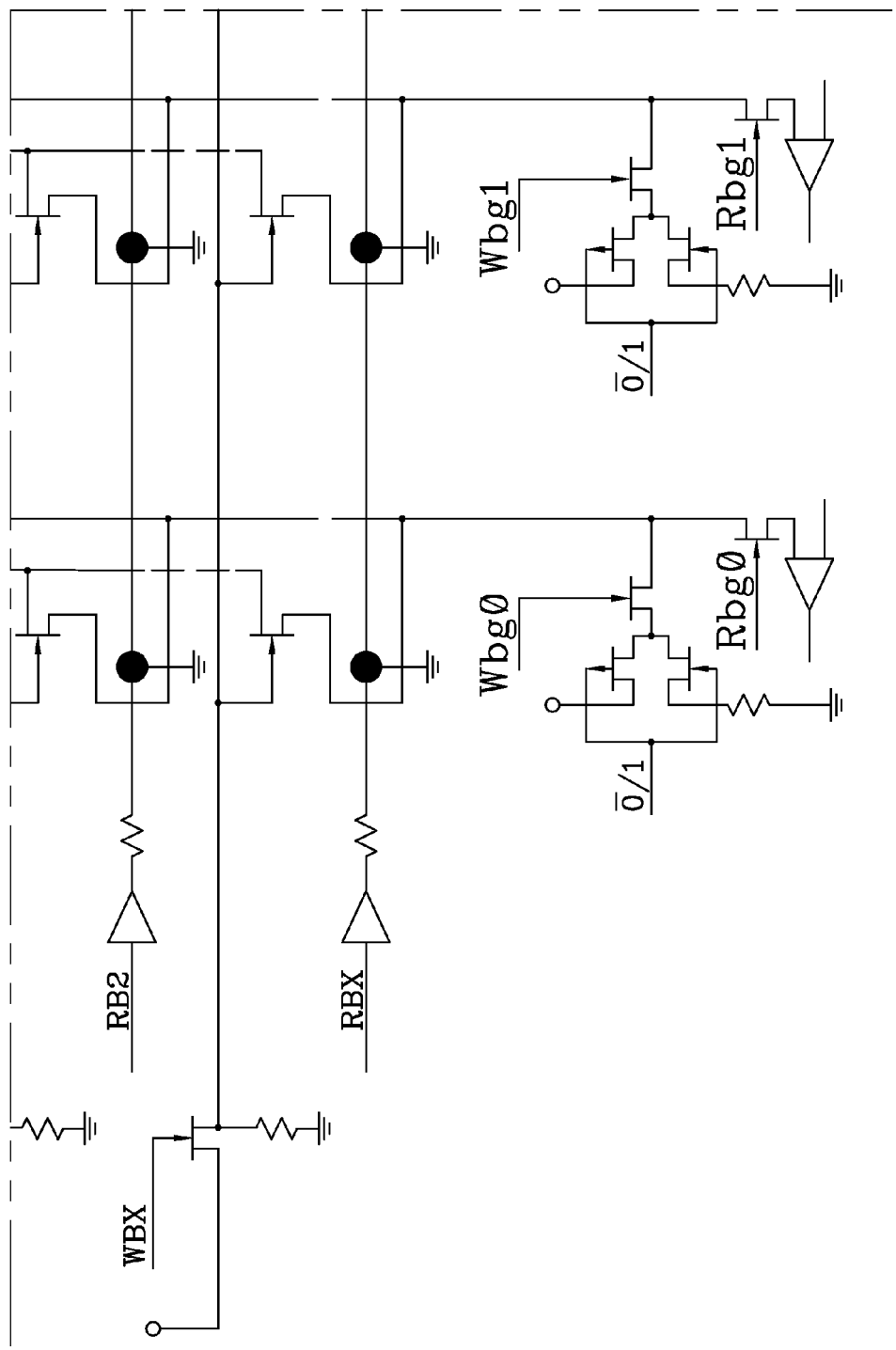
Figure 9:
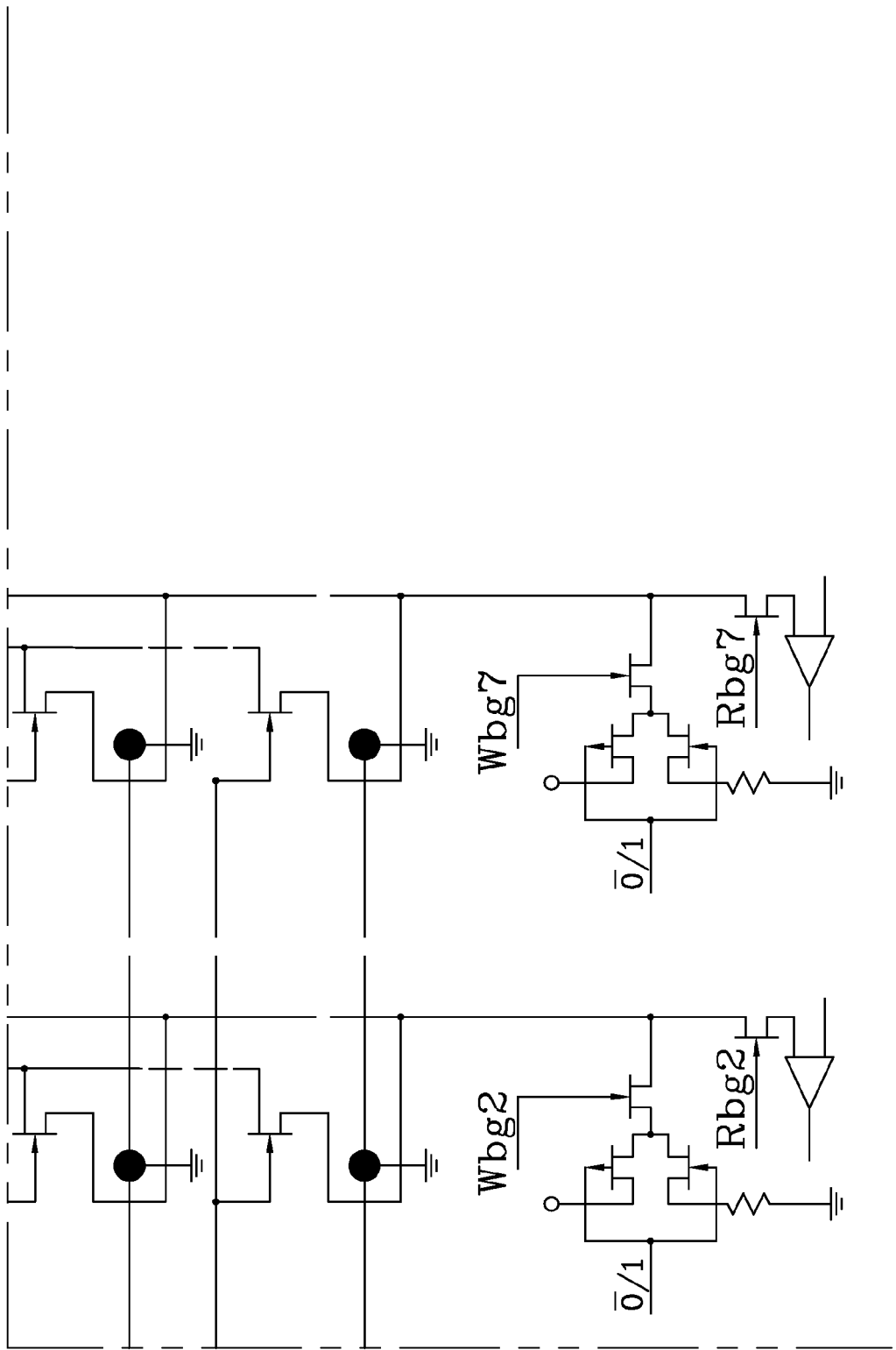

FIGS. 3 and 4 illustrate a coil sensor memory device according to one embodiment of the invention. The illustrated memory device rests on a substrate 360, such as but not limited to a silicon wafer. The illustrated substrate 360 has been cut away in FIG. 3 to show materials disposed therein.

The illustrated coil sensor memory device includes a ground 310 conductively coupled to a magnetic bit 400 resting on a nub 420 that is resting on a read select line 320. The nub 420 advantageously raises an end magnetic bit 400 such that the illustrated write/sense coil 410 may be relatively disposed closer to or even possibly protrude some amount beyond an end of the magnetic bit 400 while still maintaining electrical isolation between the read module and the write/sense coil 410. It is theorized that positioning the write/sense coil nearer an end of the magnetic bit advantageously places the coil in a position where it is exposed to a stronger signal induced in the write/sense coil by the read pulse signal. It is understood that because coils and bits may be shaped and oriented differently than as shown in the drawings, it may be that strong interactions between the coil and bit may be in positions other than that described herein and that one skilled in the art would be able, through theory and/or experimentation, to at least approximately determine other positions of strong interaction and nubs and other structure may be configured to exploit such.

There is also shown a write/sense coil 410 proximate the magnetic bit 400 and conductively coupled to a write write/sense return line 330 and to a cell select module, illustrated as a Field-Effect Transistor (FET) (collectively 350, 450, and 460) through a drain/source 470. The corresponding drain/source 430 is coupled to the write/sense source line 370. The gate of the FET is controlled through a byte select gate 340. The FET allows a user to selectively activate the write/sense coil for write and/or sense activities. Advantageously, all bit specific functions may be controlled with a single transistor. This results in a substantial savings in manufacturing costs, design costs, and a substantial increase in reliability of such memory devices.

FIG. 5 is a chart showing appropriate combination of FIGS. 6-9. In particular, FIGS. 6-9 are configured to illustrate a schematic representation of an array of coil sensor memory devices when the figures are arranged to be viewed together as shown in FIG. 5.

FIGS. 6-9 are together a schematic representation of an array of coil sensor memory devices according to one embodiment of the invention. In particular, there is shown a two-dimensional array of magnetic bits 600 conductively coupled to grounds 660 and to a one dimensional array of byte select lines 640. There is also shown a write/sense coil 650 disposed about each of the magnetic bits 600. The write/sense coils 650 each coupled to a FET 620 and to a one dimensional array of write/sense return lines 670. The FET 620 are coupled to a one dimensional array of byte select gates 610 and to a one dimensional array of write/sense source lines 630. The various lines 610, 630, 640, and 670 are coupled to modules for utilizing, observing, and/or manipulating the lines as desired. Exemplary modules are illustrated in the drawings.

FIG. 10 shows a pair of conceptual signal timing diagrams according to one embodiment of the invention. References to objects refer to those described in FIGS. 6-9, but one skilled in the art would recognize that the same or similar timing diagrams could apply to other array configurations and also that events other than those described in this Figure may occur within the illustrated array of FIGS. 6-9.

There is shown a write time diagram 1000 and a read time diagram 1002. Each diagram includes four charts aligned in time. The illustrated charts include a byte select line 1010, a line 1020 representing Wbgn (See FIG. 8) in the case of write time 1000 and representing a read pulse line 640 (See FIG. 6) in the case of read time 1002, and a pair of alternative write/sense coil lines 1030 and 1040 relating to differing write operations.

In the illustrated timing diagrams, during write time 1000, a byte select signal WBn 1012 is invoked to raise a byte select line, thus gating ON all eight (8) Bit switches. Bracketed by the rise and fall of this gate, the one or zero (1 or 0) select and driver circuits at the terminations of Bit Data Lines are enabled by a derivative of Wbn, the signal Wbgn 1022. During this time, depending upon the data to be imposed on individual Bits in the selected Byte, current is raised in one direction or another (1032 or 1042) on the Bit Data Lines 630 and 670 (See FIG. 6), through the Bit Select Switches or FET 620 (See FIG. 6) and the associated Coils 650, thus setting magnetic fields into the selected Bits of the selected Byte.

During Read time 1002, Byte Select signal WBn 1014 is again raised to enable the bit select switches or FET 620. Derivative signals Rbgn, are also invoked, causing the switches to be gated ON, thus setting a ground-oriented bias on the bit data lines, through the coils 650, and to a Comparator input. Bracketed by these two (2) strobes or gates, one or more byte read pulses 1024 are raised on read pulse lines 640 having a current limiting resistor. The pulse(s) 1024 are passed to the bits 600 in parallel, thence to the ground 660. This causes a disturbance in the coil(s) 650. The disturbance will be different depending upon the magnetic polarity of the individual bit 600. The resulting disturbance (illustrated by 1034 or 1044) on the coil will be felt at a comparator and the magnetic orientation (or state toggle) of the bit is thereby determined It is understood that the above-described embodiments are only illustrative of the application of the principles of the present invention. The present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

For example, although the figures illustrate a particular relative size and shape for the nub, it is understood that there are a near infinite variety of shapes and sizes for nubs and for other material deposition configurations that would provide spacing for allowing a write/sense coil to be disposed at or near an end of a magnetic bit while remaining electrically isolated.

Additionally, although the figures illustrate a particular relative size and shape for the write/sense coil, it is understood that there are a near infinite variety of shapes and sizes of write/sense coils from which one skilled in the art may choose that are able to cause a state change in the magnetic bit and are able to perceive evidence of such. One non-limiting example includes notching the write/sense coil such that a majority of the coil may rest in the substantially identical plane as a byte select line while remaining electrically isolated therefrom.

It is also envisioned that the illustrated ground may be replaced by a read pulse return line.

It is expected that there could be numerous variations of the design of this invention. An example is that the ground and read pulse lines may be disposed at ends of the magnetic bit opposite to those illustrated.

Finally, it is envisioned that the components of the device may be constructed of a variety of materials, including conductors and semi-conductors of all kinds and composites thereof. Further, the magnetic bit may include materials having magnetic properties of all kinds including those other than ferromagnetic.

Thus, while the present invention has been fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims. Further, it is contemplated that an embodiment may be limited to consist of or to consist essentially of one or more of the features, functions, structures, methods described herein.

What is claimed is:

1. A non-volatile random access memory device, comprising:
    a) a magnetic bit having a first end and a second end;
    b) a write/sense coil proximate the magnetic bit and not in electrical communication with the magnetic bit;
    c) a read pulse module in electrical communication with the magnetic bit at the first end and at the second end and configured to send a read pulse signal to the magnetic bit;
    d) a write module in electrical communication with the write/sense coil and configured to thereby change the magnetic bit between a first magnetic polarity state and a second magnetic polarity state;
    e) a read module in sensory communication with the write/sense coil and configured to detect a first electrical characteristic of the write/sense coil when a read pulse signal is delivered to the magnetic bit in the first magnetic polarity state and to detect a second electrical characteristic of the write/sense coil when a read pulse signal is delivered to the magnetic bit in the second magnetic polarity state.

2. The non-volatile random access memory device of claim 1, wherein the write/sense coil loops about the magnetic bit.

3. The non-volatile random access memory device of claim 2, wherein the write/sense coil loops only a single time about the magnetic bit.

4. The non-volatile random access memory device of claim 3, wherein the write/sense coil is disposed near one of the first and the second ends of the magnetic bit.

5. The non-volatile random access memory device of claim 4, wherein the write/sense coil includes a single loop and a pair of arms extending from the loop and wherein the magnetic bit is coupled to a protrusion from the read pulse module.

6. The non-volatile random access memory device of claim 1, wherein the read pulse module includes a read select line and a read return line.

7. The non-volatile random access memory device of claim 6, wherein the read return line comprises a ground plane layer disposed over a substrate.

8. The non-volatile random access memory device of claim 7, wherein the read pulse module effectively includes only a single current limiting resistor and wherein the read pulse module is in communication with a plurality of memory devices.

9. The non-volatile random access memory device of claim 1, wherein the read module includes a comparator.

10. The non-volatile random access memory device of claim 1, wherein the cell select module selectably electrically isolates the write/sense coil from the write module.

11. The non-volatile random access memory device of claim 9, wherein the cell select module selectably electrically isolates the write/sense coil from the read module.

12. The non-volatile random access memory device of claim 10, wherein the cell select module includes a field effect transistor.

13. The non-volatile random access memory device of claim 11, wherein the cell select module consists essentially of a single field effect transistor.

14. The non-volatile random access memory device of claim 1, further comprising a cell select module in electrical communication with the write/sense coil and configured to selectably electrically isolate the write sense coil.

15. The non-volatile random access memory device of claim 14, further comprising; a byte select gate in communication with the cell select module and configured to toggle function of the cell select module, wherein the byte select gate is in electrical communication with a gate of the field effect transistor.

16. A non-volatile random access memory system, comprising:
 a) a magnetic bit having a first end and a second end;
 b) a write/sense coil proximate the magnetic bit and not in electrical communication with the magnetic bit, wherein the write/sense coil loops about the magnetic bit, wherein the write/sense coil loops only a single time about the magnetic bit, wherein the write/sense coil is disposed near one of the first and the second ends of the magnetic bit, wherein the write/sense coil includes a single loop and a pair of arms extending from the loop;
 c) a read pulse module in electrical communication with the magnetic bit at the first end and at the second end and configured to send a read pulse signal to the magnetic bit, wherein the read pulse module includes a read select line and a read return line, wherein the read return line comprises a ground plane layer disposed over a substrate, wherein the read pulse module includes a current limiting resistor;
 d) a write module in electrical communication with the write/sense coil and configured to thereby change the magnetic bit between a first magnetic polarity state and a second magnetic polarity state;
 e) a read module in sensory communication with the write/sense coil and configured to detect a first electrical characteristic of the write/sense coil when a read pulse signal is delivered to the magnetic bit in the first magnetic polarity state and to detect a second electrical characteristic of the write/sense coil when a read pulse signal is delivered to the magnetic bit in the second magnetic polarity state, wherein the read module includes a comparator;
 f) a cell select module in electrical communication with the write/sense coil and configured to selectably electrically isolate the write sense coil, wherein the cell select module selectably electrically isolates the write/sense coil from the write module, wherein the cell select module selectably electrically isolates the write/sense coil from the read module, wherein the cell select module includes a field effect transistor, wherein the cell select module consists essentially of a single field effect transistor; and
 g) a byte select gate in communication with the cell select module and configured to toggle function of the cell select module, wherein the byte select gate is in electrical communication with a gate of the field effect transistor.

17. A non-volatile random access memory device, comprising:
 a) a magnetic bit, having a cylindrical form with an opposite first and second end;
 b) a write/sense coil, shaped to circumnavigate at least once about the magnetic bit,
 c) a read pulse module, designed to send a read pulse signal to the magnetic bit; and
 d) a write module, designed to create a first and second state in the magnetic bit.

18. The non-volatile random access memory device of claim 17, further comprising a read module, in sensory communication with the write/sense coil, and configured to detect a first and second electrical characteristic of the write/sense coil when a read pulse signal is delivered to the magnetic bit in the first and second magnetic polarity state respectively.

19. The non-volatile random access memory device of claim 18, further comprising a cell select module in electrical communication with the write/sense coil and configured to selectably electrically isolate the write sense coil, wherein the cell select module selectably electrically isolates the write/sense coil from the write module, wherein the cell select module selectably electrically isolates the write/sense coil from the read module, wherein the cell select module includes a field effect transistor, wherein the cell select module consists essentially of a single field effect transistor.

20. The non-volatile random access memory device of claim 19, further comprising a byte select gate in communication with the cell select module and configured to toggle function of the cell select module, wherein the byte select gate is in electrical communication with a gate of the field effect transistor.

21. The non-volatile random access memory device of claim 20, wherein the write/sense coil is disposed near one of the first and the second ends of the magnetic bit, wherein the write/sense coil includes a single loop and a pair of arms extending from the loop.

22. The non-volatile random access memory device of claim 21, further comprising a read select module at the first end and at the second end and wherein the read pulse module includes a read select line and a read return line, wherein the read return line comprises a ground plane layer disposed over a substrate, wherein the read pulse module includes a current limiting resistor.

23. The non-volatile random access memory device of claim 22, wherein the read module includes a comparator.

* * * * *